United States Patent
Freitag et al.

(10) Patent No.: US 7,310,209 B2
(45) Date of Patent: Dec. 18, 2007

(54) MAGNETORESISTIVE SENSOR HAVING A HIGH COERCIVITY HARD MAGNETIC BIAS LAYER DEPOSITED OVER A METALLIC LAYER

(75) Inventors: James Mac Freitag, San Jose, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 514 days.

(21) Appl. No.: 10/954,803

(22) Filed: Sep. 29, 2004

(65) Prior Publication Data

US 2006/0067014 A1    Mar. 30, 2006

(51) Int. Cl.
G11B 5/33 (2006.01)
G11B 5/127 (2006.01)

(52) U.S. Cl. .............. 360/324.12; 360/324.1; 360/324.11

(58) Field of Classification Search ............. 360/324.1, 360/324.12
See application file for complete search history.

(56) References Cited

U.S. PATENT DOCUMENTS

| | | | | |
|---|---|---|---|---|
| 5,801,984 A | * | 9/1998 | Parkin | 365/158 |
| 5,883,764 A | * | 3/1999 | Pinarbasi | 360/322 |
| 5,898,548 A | * | 4/1999 | Dill et al. | 360/324.2 |
| 5,936,293 A | * | 8/1999 | Parkin | 257/422 |
| 5,959,810 A | * | 9/1999 | Kakihara et al. | 360/324.12 |
| 6,128,167 A | * | 10/2000 | Saito et al. | 360/324.12 |
| 6,185,081 B1 | * | 2/2001 | Simion et al. | 360/327.3 |
| 6,577,477 B1 | * | 6/2003 | Lin | 360/324.12 |
| 6,636,400 B2 | | 10/2003 | Pinarbasi et al. | 360/324.12 |
| 6,657,825 B2 | * | 12/2003 | Ho et al. | 360/321 |
| 6,876,525 B2 | * | 4/2005 | Lin et al. | 360/324.12 |
| 7,016,165 B2 | * | 3/2006 | Chien et al. | 360/324.12 |
| 7,020,951 B2 | * | 4/2006 | Lin et al. | 29/603.14 |
| 7,036,208 B2 | * | 5/2006 | Ho et al. | 29/603.13 |
| 2002/0015268 A1 | | 2/2002 | Mao et al. | 360/324.12 |
| 2002/0181171 A1 | | 12/2002 | Chien et al. | 360/324.12 |
| 2003/0008099 A1 | | 1/2003 | Nishikawa et al. | 428/65.3 |
| 2003/0058586 A1 | | 3/2003 | Pinarbasi et al. | 360/324.12 |
| 2004/0042130 A1 | | 3/2004 | Lin et al. | 360/324.12 |
| 2004/0072022 A1 | | 4/2004 | Kanbe et al. | 428/692 |
| 2004/0095691 A1 | | 5/2004 | Lin et al. | 360/324.1 |

* cited by examiner

*Primary Examiner*—Angel Castro
*Assistant Examiner*—Christopher R. Magee
(74) *Attorney, Agent, or Firm*—Zilka-Kotab, PC

(57) ABSTRACT

A magnetoresistive sensor having hard bias layers constructed of CoPtCrB, which high coercivity when deposited over crystalline materials such as an AFM layer or other sensor material. The bias layer material exhibits high coercivity and high moment even when deposited over a crystalline structure such as that of an underlying sensor material by not assuming the crystalline structure of the underlying crystalline layer. The bias layer material is especially beneficial for use in a partial mill sensor design wherein a portion of the sensor layers extends beyond the active area of the sensor and the bias layer must be deposited on the extended portion of sensor material.

22 Claims, 3 Drawing Sheets

MAGNETORESISTIVE SENSOR HAVING A HIGH COERCIVITY HARD MAGNETIC BIAS LAYER DEPOSITED OVER A METALLIC LAYER

FIELD OF THE INVENTION

The present invention relates to free layer biasing in a magnetoresistive sensor, and more particularly to a bias layer having superior hard magnetic properties when formed over a crystalline structure.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetic moment, when exchange coupled with a magnetic material, it can strongly pin the magnetization of the ferromagnetic layer.

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

As those skilled in the art will appreciate, the distance between the shields (gap thickness) determines the bit length for the read sensor. With the ever increasing pressure to increase data capacity and data rate, engineers are constantly under pressure to decrease the bit length (and therefore gap thickness) of read sensors. One way to decrease this gap thickness is by a partial mill process. Sensors have traditionally been constructed by depositing sensor layers as full film layers onto the first gap layer. A photoresist mask is then formed over the area that is to be the sensor and a material removal process such as ion milling is performed to remove material from the areas not covered by the mask. This material removal process has traditionally been performed down into the first gap layer, removing a portion of the first gap material at either side of the sensor.

Since this material removal process removes a portion of the first gap layer, it has been necessary to deposit a thick first gap layer in order prevent electrical shorts through the gap to the first shield. Such a short would be a catastrophic event that would render the sensor unusable. In these prior art heads, hard bias layers, constructed of a hard magnetic material such as CoPtCr have then been deposited over this etched out portion of the first gap layer at either side of the sensor to provide magnetic biasing to bias the magnetic moment of the free layer in the desired direction parallel with the ABS.

As discussed above, the removal of a portion of the first gap during formation of the sensor requires a larger overall gap thickness to prevent shorting. One way to overcome this is to use a partial mill process in which the material removal process (ie. ion milling) used to construct the sensor is terminated prior to complete removal of the sensor layers, such as when the material removal reaches the AFM layer (usually PtMn) near the bottom of the sensor. By stopping the milling process within the sensor material layers no gap material is removed. This allows a much thinner gap to be deposited. The bias layers are then deposited on top of the remaining sensor layers outside of the active area of the sensor rather than on the gap layer.

A problem that arises from such partial milling is that the bias layer properties are different when deposited over the crystalline sensor layers (such as the AFM layer) than they are when deposited over the gap layer. The gap layer, is amorphous. It therefore has no crystalline structure to impart to the hard bias material when the material is deposited onto the gap. Therefore, a hard bias layer deposited over the amorphous gap layer can exhibit a desired epitaxial growth that provides desired high moment and high coercivity needed for free layer biasing.

However, the sensor layers such as the AFM layer (PtMn for example) are not amorphous and exhibit their own grain structure. When the hard bias layers are deposited over these sensor layers, the grain structure of the underlying sensor layer carries through to the hard bias layer. This grain structure being undesirable for optimal hard bias properties results in degraded biasing properties. This leads to free layer instability and associated signal noise. For example, depositing a CoPtCr hard magnetic material with a Cr seed layer over a PtMn substrate results in a CoPtCr hard bias layer with a coercivity of only around 600 Oe. This is much lower than the roughly 1400 Oe coercivity obtained when the same hard bias layer and seed are deposited on a glass (amorphous) substrate.

Therefore there is a strong felt need for hard bias structure that can be formed over a crystalline material, such as an AFM material or other sensor layer, while still exhibiting the necessary hard magnetic properties needed for effective free layer biasing. Such a bias structure would preferably capable of being deposited over a crystalline structure without taking on the undesirable grain structure of the underlying crystalline layer.

SUMMARY OF THE INVENTION

The present invention provides a magnetoresistive sensor having improved free layer biasing. The sensor includes first and second hard magnetic layers that extend outward from first and second sides of a sensor stack. The hard magnetic layers each comprise CoPtCrB.

The hard bias layers of a the present invention have an advantageous high coercivity when deposited over a crystalline structure such an antiferromagnetic layer (PtMn for example) or other sensor layer, as would be necessary in a partial mill sensor design.

The hard bias layers can be deposited over a seed layer that may be for example CrMo, Ta/Si/Cr, CrMo/Si/CrMo or Cr/Si/CrMo. The sensor can be constructed according to a partial mill processes, wherein the sensor has a sensor stack having first and second sides that define a track width, or active area of the sensor, and wherein a portion of the sensor layers such as an antiferromagnetic (AFM) layer has laterally extending portions that extend laterally outward beyond the side walls of the sensor stack. The seed layer and bias layers can then be formed on top of these laterally extending sensor layer portions.

Whereas prior art hard bias structures have exhibited poor coercivity when deposited over a crystalline structure such as an AFM layer in a partial mill design, the bias layer structure of the present invention exhibits excellent coercivity when deposited over such structures.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
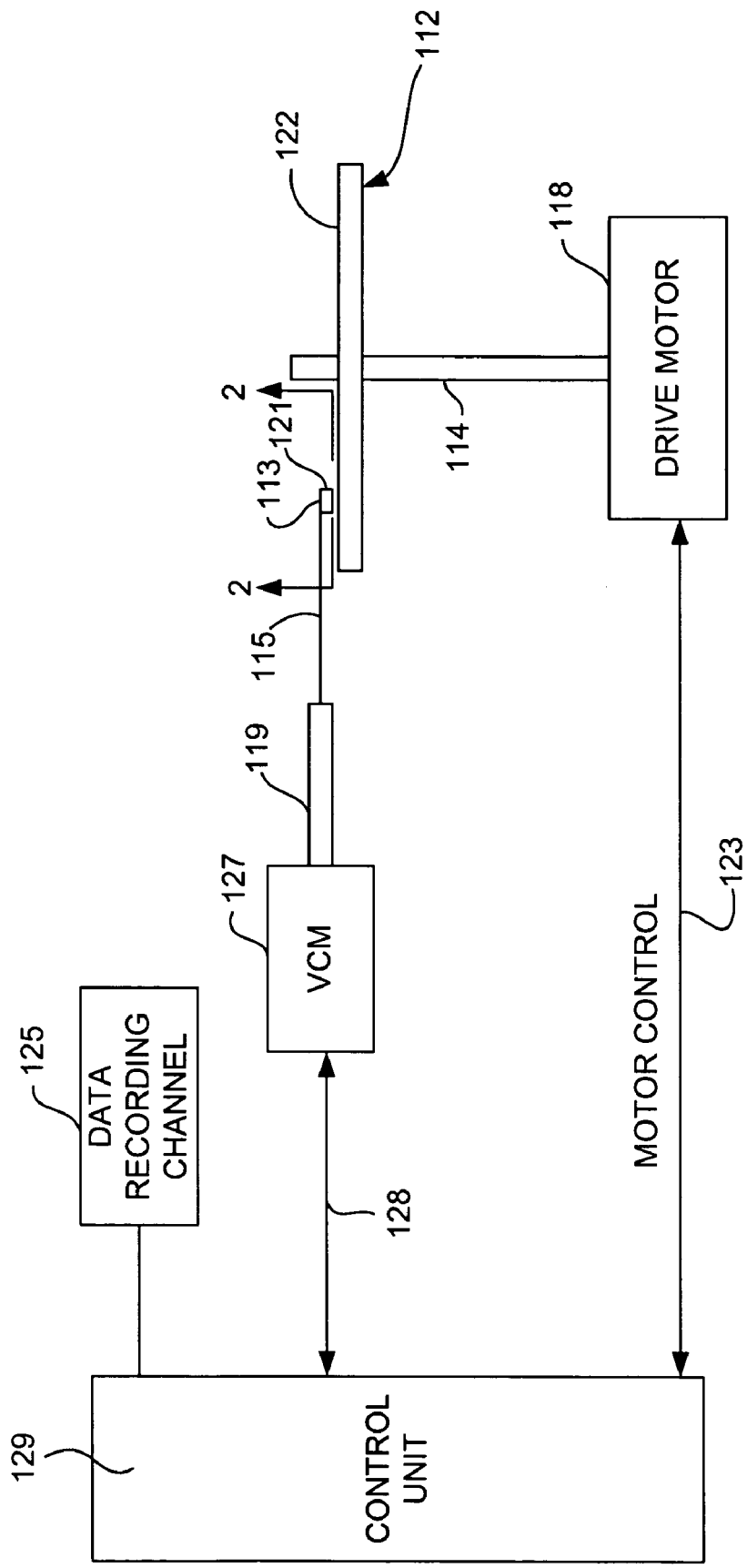
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
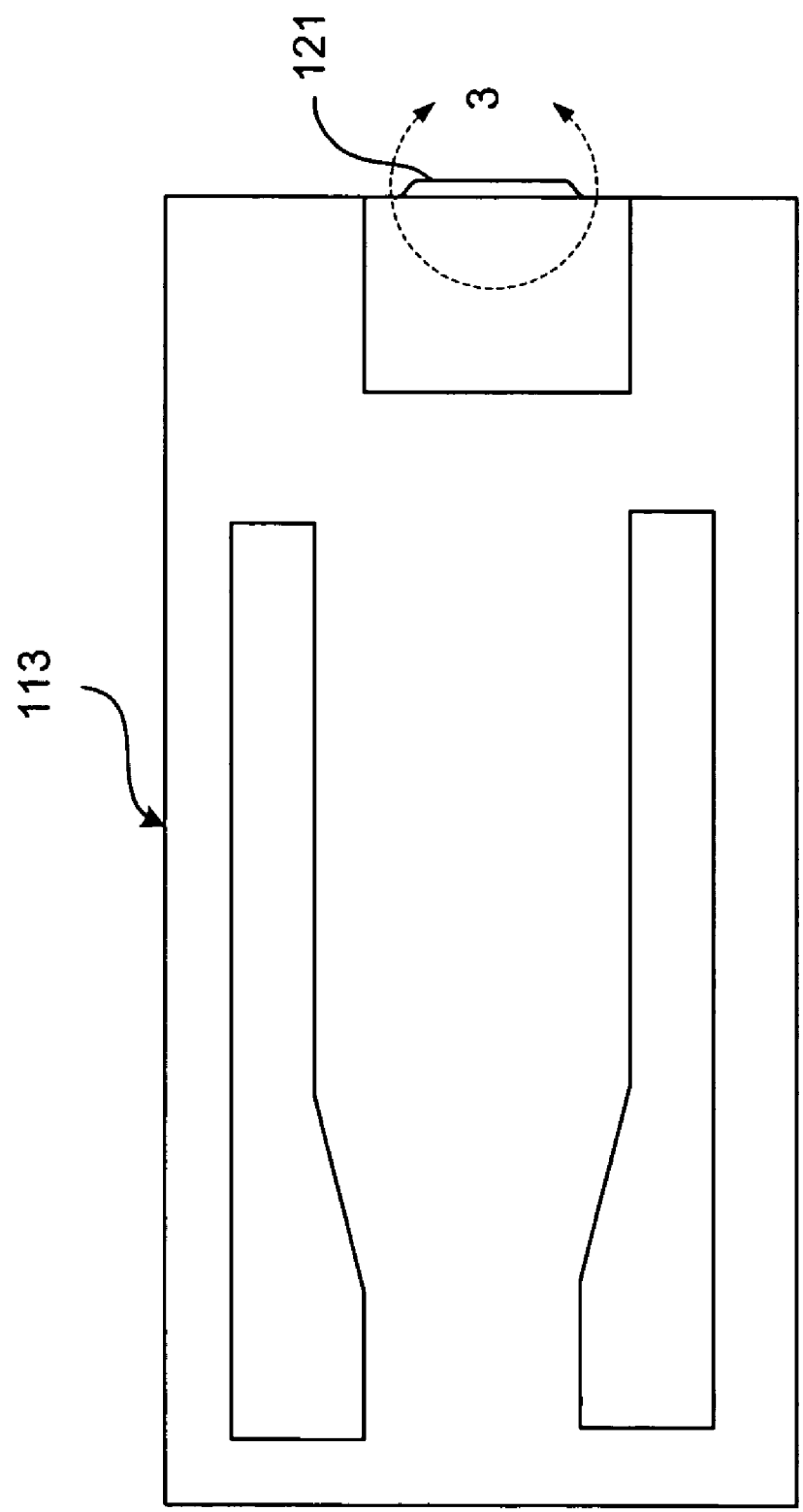
FIG. 2 is an ABS view of a slider, taken from line 3-3 of FIG. 2, illustrating the location of a magnetic head thereon.
Figure 3:
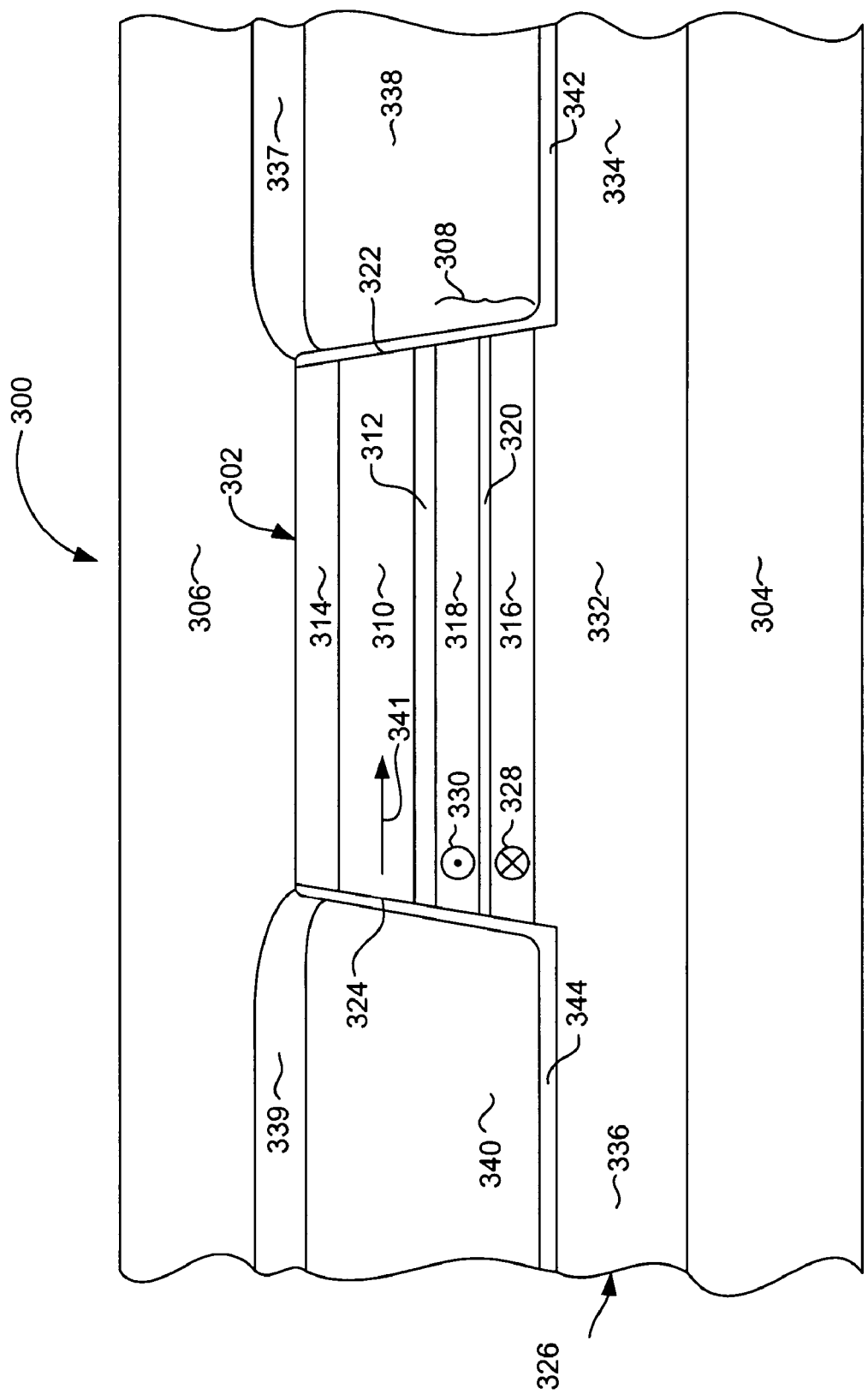
FIG. 3 is an ABS view of a magnetic sensor according to an embodiment of the present invention taken from circle 3 of FIG. 2.

With reference to FIG. 2, the orientation of the magnetic head 121 in a slider 113 can be seen in more detail. FIG. 3 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

With reference now to FIG. 3, a magnetoresistive sensor 300 according to an embodiment of the invention includes sensor stack 302 sandwiched between first and second gap layers 304, 306. The sensor stack 302 includes a magnetic pinned layer structure 308 and a magnetic free layer 310. A non-magnetic, electrically conductive spacer layer 312, such as Cu, is sandwiched between the free layer 310 and the pinned layer structure 308. A capping layer 314, such as Ta, may be provided at the top of the sensor stack 302 to protect the sensor from damage during manufacturing, such as from corrosion during subsequent annealing processes.

The pinned layer 308 can be a simple pinned structure or an antiparallel (AP) pinned structure and is preferably an AP pinned structure including first and second magnetic layers (AP1) 316, and (AP2) 318 which may be for example CoFe exchange coupled with and antiparallel coupled across a thin AP coupling layer 320 such as Ru. The free layer 310 can be constructed of various magnetic materials such as NiFe or CoFe, and may include a layers of CoFe and NiFe, preferably with a layer of CoFe or Co adjacent to the spacer 312 for optimal sensor performance.

As can be seen with reference to FIG. 3, the sensor stack 302 has first and second laterally opposed side walls 322, 324 that define the track-width or active area of the sensor. A layer of antiferromagnetic material (AFM) 326, preferably PtMn, formed at the bottom of the sensor stack 302 is exchange coupled with the AP1 layer 316. The AFM layer 326 when exchange coupled with the AP1 layer 316 strongly pins the magnetic moment of the AP1 layer 316 as indicated by arrowhead 328. This in turn strongly pins the moment 330 of the AP2 layer 318 by antiparallel coupling across the AP coupling layer 320. Also as can be seen, the AFM layer 326 has a portion 332 that is disposed within the track width or active area of the sensor 300, but also has first and second laterally extending portions 334, 336 that extend laterally outward beyond the active area of the sensor 300. The laterally extending portions 334, 336 may be slightly thinner than the inner portion 332 due to a partial milling process used to construct the sensor 300. It should be pointed out that although only the AFM layer 326 is shown as extending beyond the active area of the sensor, the laterally extending portions 334, 336 could include other sensor layers as well, such as the pinned layer 308 or spacer layer 312. As long as lateral sides of the free layer 310 have been defined, the track width will also be well defined.

With continued reference to FIG. 3, the sensor 300 includes first and second hard magnetic, bias layers (HB layers) 338, 340. In addition, first and second leads 337, 339 are formed over the HB layers 338, 340. The leads 337, 339 may be constructed of, for example, Ta, Au, Rh or some other electrically conducting material. The HB layers 338, 340 are constructed of an alloy containing Co, Pt, Cr and B. The HB layers 338, 340 preferably contain 2 to 10 atomic percent B or about 6 atomic percent B. The HB layers 338, 340 may be constructed of CoPtCrB having about the following concentrations: CoPt(12), Cr(6), and B(6). The hard bias layers 338, 340 have a high magnetic coercivity, high squareness, and stabilize the free layer 310 by exerting a magnetic field in a direction parallel with the ABS as indicated by arrow 341.

Seed layers 342, 344 may be provided beneath the HB layers 338, 340. The seed layers 342, 344 are may be constructed of, for example, CrMo, Ta/Si/Cr, CrMo/Si/CrMo or Cr/Si/CrMo. The seed layers 342, 344 may be constructed as a single layer of CrMo or could also be constructed as first and second layers of CrMo with a layer of Si or some other material sandwiched between the layers of CrMo. The seed layers 342, 344 could also include layers of Ta and Cr or some other material with a layer of Si or some other material sandwiched there between. The seed layers 342, 344 extend over the laterally extending portions 334, 336 of the AFM layer or other sensor layers, as well as over the side walls 322, 324 of the sensor stack 302.

This new hard magnetic material (CoPtCrB) has been demonstrated to have a very high coercivity and squareness when deposited over the AFM material 332. Although various compositions are possible, excellent results have been achieved with CoPt(12)Cr(6)B(6). One of the unique results of using this biasing material is that the coercivity of this CoPtCrB material is over 1700 Oe when deposited over a PtMn AFM layer while the coercivity when deposited over a glass (amorphous) material is about 1500 Oe. This is substantially different from other prior art biasing materials which have exhibited higher coercivity when deposited over a glass substrate and a low coercivity when deposited over a crystalline material such as an AFM material. In addition to increasing the coercivity, the presence of B in the CoPtCrB biasing material decreases the grain size of the HB layers 338, 340. This decreased grain size improves free layer stability.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a sensor stack having first and second laterally opposed sides; and
   first and second hard magnetic layers extending laterally outward from the first and second sides of the sensor stack, the first and second hard magnetic layers comprising CoPtCrB.

2. A magnetoresistive sensor as in claim 1, further comprising a seed layer underlying each of the first and second hard magnetic layers.

3. A. magnetoresistive sensor as in claim 1 wherein the hard bias layers each comprises CoPtCrR having about: 6 atomic percent Cr and about 6 atomic percent B.

4. A magnetoresistive sensor, comprising:
   a sensor stack having first and second laterally opposed sides defining an active area of the sensor;
   a layer an antiferromagnetic material formed within the sensor stack and having first and second laterally extending portions that each extend beyond the active area of the sensor, the laterally extending portions of the antiferromagnetic layer each having an upper surface; and first and second hard magnetic layers formed over the first and second laterally extending portions of the antiferromagnetic material, the first and second hard magnetic layers each comprising CoPtCrB.

5. A magnetoresistive sensor as in claim 4 wherein the first and second hard magnetic layers are disposed adjacent to the first and second sides of the sensor and extend laterally outward therefrom.

6. A magnetoresistive sensor as in claim 4 further comprising a seed layer disposed between each of the laterally extending portions of the antiferromagnetic material and the hard magnetic layers.

7. A magnetoresistive sensor as in claim 4, wherein the antiferromagnetic layer comprises PtMn.

8. A magnetoresistive sensor, comprising:
a layer of antiferromagnetic material;
a magnetic pinned layer structure formed over and exchange coupled with the layer of antiferromagnetic material;
a non-magnetic electrically conductive spacer layer formed over the magnetic pinned layer;
a magnetic free layer formed over the spacer layer, the free layer having first and second laterally opposed sides defining an active area of the sensor;
the layer of antiferromagnetic material having laterally extending portions that extend beyond the active area of the sensor, the laterally extending portions each having a surface; and
a layer of hard magnetic material comprising CoPtCrB formed over the laterally extending portions of the antiferromagnetic material.

9. A magnetoresistive sensor as in claim 8 further comprising a seed layer formed between antiferromagnetic material layer and each layer of hard magnetic material and contacting each side of the free layer.

10. A magnetoresistive sensor as in claim 8 wherein the layer of antiferromagnetic material comprises PtMn.

11. A magnetoresistive sensor as in claim 1 wherein the hard magnetic layers each comprise 2 to 10 atomic percent B.

12. A magnetoresistive sensor as in claim 4 wherein the hard magnetic layers each comprise 2 to 10 atomic percent B.

13. A magnetoresistive sensor, comprising:
a plurality of sensor layers;
at least one of the plurality of sensor layers terminating at first and second sides defining, an active area;
at least one of the plurality of sensor layers having first and second laterally extending portions that extend laterally beyond the active area of the sensor; and
first and second hard magnetic layers formed over the first and second laterally extending portions, the first and second hard magnetic layers comprising CoPtCrB.

14. A magnetoresistive sensor as in claim 13 wherein the first and second hard magnetic layers each comprise 2 to 10 atomic percent B.

15. A magnetoresistive sensor as in claim 13 wherein the first and second hard magnetic layers each comprise about 6 atomic percent B.

16. A magnetoresistive sensor as in claim 13 further comprising a seed layer disposed between the hard magnetic layers and the laterally extending portions.

17. A magnetoresistive sensor comprising:
a layer of material having a crystalline structure; and
a hard magnetic liner formed over the material having a crystalline structure, the hard magnetic layer comprising CoPtCrB.

18. A magnetoresistive sensor as in claim 17 further comprising a seed layer disposed between the layer having a crystalline structure and the hard magnetic layer.

19. A magnetoresistive sensor as in claim 17 wherein the hard bias layer comprises 2 to 10 atomic percent B.

20. A magnetoresistive sensor as in claim 17 wherein the hard bias layer comprises about 6 atomic percent B.

21. A magnetic data storage system, comprising:
a magnetic medium;
a an actuator;
a slider connected with the actuator for movement adjacent to a surface of the magnetic medium;
a magnetoresistive sensor connected with the slider, the magnetoresistive sensor comprising;
a layer of crystalline material; and
a hard magnetic material formed over the crystalline material layer, the hard magnetic material comprising CoPtCrB.

22. A data storage system as in claim 21 wherein the hard magnetic material comprises 2 to 10 atomic percent B.

* * * * *

UNITED STATES PATENT AND TRADEMARK OFFICE
CERTIFICATE OF CORRECTION

PATENT NO. : 7,310,209 B2  Page 1 of 1
APPLICATION NO. : 10/954803
DATED : December 18, 2007
INVENTOR(S) : Freitag et al.

It is certified that error appears in the above-identified patent and that said Letters Patent is hereby corrected as shown below:

In claim 3, column 6, line 61, replace "CoPtCrR" with --CoPtCrB--.

In claim 17, column 8, line 22, replace "liner" with --layer--.

Signed and Sealed this

Third Day of August, 2010

David J. Kappos
*Director of the United States Patent and Trademark Office*